United States Patent
Kajola et al.

(10) Patent No.: US 7,649,351 B2
(45) Date of Patent: Jan. 19, 2010

(54) METHOD FOR INTERFERENCE SUPPRESSION IN A MEASURING DEVICE

(75) Inventors: Matti Kajola, Helsinki (FI); Lauri Parkkonen, Helsinki (FI); Juha Simola, Helsinki (FI); Samu Taulu, Helsinki (FI)

(73) Assignee: Elekta AB (publ) (SE)

( * ) Notice: Subject to any disclaimer, the term of this patent is extended or adjusted under 35 U.S.C. 154(b) by 366 days.

(21) Appl. No.: 10/587,354

(22) PCT Filed: Feb. 11, 2005

(86) PCT No.: PCT/FI2005/000090

§ 371 (c)(1),
(2), (4) Date: Jul. 2, 2007

(87) PCT Pub. No.: WO2005/078467

PCT Pub. Date: Aug. 25, 2005

(65) Prior Publication Data

US 2009/0184709 A1 Jul. 23, 2009

(30) Foreign Application Priority Data

Feb. 13, 2004 (FI) .................................. 20040233

(51) Int. Cl.
*G01R 33/00* (2006.01)
*A61B 5/05* (2006.01)

(52) U.S. Cl. ...................... 324/244; 600/409; 702/189; 702/191

(58) Field of Classification Search ................. 324/239, 324/243–244, 256–258; 600/409; 702/189, 702/191; 607/100, 103
See application file for complete search history.

(56) References Cited

U.S. PATENT DOCUMENTS 3,801,877 A 4/1974 Griese et al.

FOREIGN PATENT DOCUMENTS

DE 197 18 649 A1 11/1998

(Continued)

OTHER PUBLICATIONS

International Search Report for PCT/FI2005/000090 dated Jun. 16, 2003.

*Primary Examiner*—Bot L LeDynh
(74) *Attorney, Agent, or Firm*—Studebaker & Brackett PC; Donald R. Studebaker

(57) ABSTRACT

The present invention describes a method enabling one to shield a device that measures weak biomagnetic signals from strong magnetic interference fields. The measurement sensors are provided with a feedback compensation loop, the difference signal of which is obtained from the measurement sensors themselves. As the actuator of the feedback function, one or more coils are responsible for eliminating, the external interference fields in the region of the sensors. Difference signals can be generated as a linear combination from the signals of two or more sensors. In the control logic, the SSS method can be used to numerically separate the biomagnetic signal being measured from the signals produced by the sources—compensation coils and interference sources—disposed outside the measurement region. The interference suppression can be enhanced by placing the assembly of sensors and the actuators within a magnetically shielding room.

20 Claims, 3 Drawing Sheets

FOREIGN PATENT DOCUMENTS

| | | |
|---|---|---|
| DE | 103 04 225 A1 | 8/2004 |
| EP | 0 396 381 A2 | 11/1990 |
| EP | 0 481 211 A2 | 4/1992 |
| EP | 0 514 027 A2 | 11/1992 |
| EP | 0 379 374 B1 | 7/1994 |
| EP | 0 966 689 B1 | 12/1999 |
| EP | 0 982 597 A2 | 3/2000 |
| FI | EP0966689 T3 | 1/2002 |
| WO | WO 2004/081595 A1 | 9/2004 |

METHOD FOR INTERFERENCE SUPPRESSION IN A MEASURING DEVICE

FIELD OF THE INVENTION

The invention relates to the shielding of a measuring device from external magnetic interferences.

BACKGROUND OF THE INVENTION

A device that measures weak biomagnetic signals is very susceptible to the influence of the strong magnetic interferences in its operational environment. This is due to the fact that compared to the biomagnetic signals being measured, the interference signals are even ten million times bigger. Furthermore, the implementation of the interference suppression is made more difficult because the region to be shielded from magnetic interferences is relatively large, tens of centimetres in its diameter.

To make biomagnetic measurements, several methods for protecting measuring devices from interference fields have been developed, which interference fields are many times larger than the interesting signals. A straightforward method of shielding is to place a sensitive magnetic measuring device inside a so-called magnetically shielding room which suppresses magnetic fields originating from sources outside the room into about 100-10,000th part.

In addition to this, to achieve magnetic shielding, it is known to use sensors the geometrical structure of which makes them unsusceptible to rather steady magnetic fields originating from distant sources. Magnetic sensors of this kind are called gradiometers. Typically, a shielding factor of about 100-1,000 against external interferences is obtained using them.

Further, the magnetic shielding can be implemented, or it can be improved, using active systems in which the magnetic interference is eliminated by means of a suitable control system in which the interference is measured in the vicinity of the region being shielded by means of a sensor or sensors; and based on this measurement, the interference field is compensated with current-carrying coils that produce by a magnetic field that is opposing with respect to the interference. Active magnetic shielding can be used either alone or combined with passive shielding methods such as a magnetic shielding room.

In this control system it is possible to use either direct coupling or feedback. When using direct coupling, the measuring device associated with the control system is disposed far from the actuator and from the region being compensated for inside the coil or coils. In this case, the control system functions simply so that one inputs into the coils a current that is proportional to the interference measured by the measuring device and is of the kind that a compensating field having, as accurately as possible, the size of the interference is formed in the region being shielded. With this kind of system it is also possible to combine a magnetic shielding room.

The performance of a compensation based on direct coupling usually is rather limited because the field intensity to be compensated for is determined far from the region being shielded. This functions in the case of one or two stationary interference sources, but when there are three or more sources, it usually is impossible to find a place for the sensor from which the field produced by all the sources could be correctly extrapolated for the region being shielded. This kind of shielding method usually gives a shielding factor of about 3 to 10, depending on the number of interference sources. The method only functions for interference sources that are disposed clearly farther from the region being shielded than the sensor controlling the control system. The method works worse for interference sources that are disposed just a little farther than the sensor controlling the control system, and specifically for sources that are disposed nearer than the sensor it does not work at all.

The sensor of the control system can also be introduced inside the compensation coil assembly near the region in which there is a wish to compensate for an interference. In that case, it is a question about a feedback control system which works better than a directly coupled one also for more complicated interferences originating from many different sources. Publication EP0514027 shows an example of a feedback control system enabling one to minimise the effect of a magnetic interference. With a feedback control system it is also possible to connect a magnetic shielding room either so that the compensation coils are disposed outside the magnetic shielding (U.S. Pat. No. 3,801,877) or inside (EP0396381 or corresponding U.S. Pat. No. 4,963,789).

Publication EP0966689 discloses a magnetic gradiometer which is used to measure diverging components of a magnetic field. In particular, the equipment can be used to measure a small changing field irrespective of the earth's magnetic field (gradient component of the magnetic field). The equipment includes at least two magnetic detectors, feedback coils; and, moreover, each feedback loop includes an amplifier and an integrator. At least two detectors have been adjusted to detect the magnetic field in the same direction. The purpose of the feedback coils is, by imitating the magnetic field produced by the environment, to eliminate the effect of interferences in the total magnetic field to be measured using detectors. To mutually balance the detector outputs, the detector outputs are processed with a signal-processing algorithm. The total energy to be obtained as a sum of the detector outputs is minimised to find out the components of the magnetic field.

In the method as shown in publication EP0966689, a biomagnetic signal being measured becomes distorted as a result of active compensation because the magnetic detectors of the method are used to detect both biomagnetic and interference signals. Publication EP0966689 does not present means to correct this distortion.

In biomagnetic applications, the volume on whose region the sensors are distributed, typically is tens of centimetres in its diameter, that is rather large. If there is a wish, in addition, to keep the set of reference sensors used for the compensation far from the source of interesting biological signals like in the prior art—then the volume containing sensors is even 50 cm in diameter. The compensation of a magnetic interference, e.g. with the accuracy of a percent (its reduction into its hundredth part), by using feedback, requires that the set of compensation coils is capable of producing the fields corresponding to the geometry of the interference fields with the accuracy of a percent in this entire volume that contains both the measurement sensors and the reference sensors that produce the difference signals of the control system. Only in this situation the control system is correctly informed of the interference to be compensated for, and the interference is compensated for in all the measurement loops, with high accuracy.

The compensation using coils producing a compensating field is made the more accurate the smaller is the volume being compensated for. For this reason it would be desirable to place the sensor of a feedback compensation system as near as possible the actual sensors of the measuring device. Previously, one thought that this cannot be done because in that case one would also compensate for the signal to be measured, as if it were an external interference.

The problem with the prior art is thus the inaccuracy of the compensation in the region of the entire set of sensors, because the interference field is measured outside the assembly of sensors. Using a separate set of reference sensors also makes the equipment too complicated.

OBJECTIVE OF THE INVENTION

The objective of the present invention is to present a solution in which the feedback information needed for the compensation of the interferences is obtained from the sensors used for the measurement itself, that is from those sensors that one intends to protect from interferences. This enables one to reach a very effective interference suppression because the interference is measured in that very place where it must be eliminated, and the size of the region to be compensated for is as small as possible.

SUMMARY OF THE INVENTION

The present invention discloses a manner deviating from the prior art of implementing magnetic shielding using a feedback compensation system that does not need a separate reference sensor or sensors giving the difference signal. In particular, the present invention can be applied to magnetographic devices (MEG) which are used to measure weak neuromagnetic signals originating from the brain.

In this method, the actual set of measurement sensors is provided with two separate feedback loops. The inner feedback loop is responsible for the feedback of a signal that is small-feature with respect to its geometry and originates from an object being monitored, and the outer feedback loop takes care of the feedback of interference signals that are bigger with respect to their amplitude and geometry. It can also be said that the inner feedback loop is a channel of an MEG device operating in a flow-locked state, and the outer feedback loop is a feedback loop that controls the compensating actuator. This enables one to end up in a situation in which big external interferences only are visible in the outer feedback loop, and do not eat away the dynamics of the inner feedback loop that contains the actual interesting signal. In a preferred embodiment, one feedback loop includes an amplifier and a feedback resistor.

The sum signal of an interference signal and an interesting signal being measured is thus measured using the sensors of the actual set of measurement sensors, by means of which the difference signal is obtained. Difference signals can be generated as a linear combination based on one or more signals measured by the measurement sensor. The compensation voltage to be obtained by means of a difference signal produces a current in the actuator. The actuator typically is a coil that produces a compensating magnetic field. There can be several of these. Compensation voltages can be produced several by means of various linear combinations based on the channels of the assembly of sensors, and these voltages can be fed into the different coils of the compensating actuating system by weighting using suitable weighting factors. A compensating magnetic field eliminates the interferences to be detected in an assembly of sensors, enabling one to dependably measure the desired biomagnetic signal that is considerably smaller in size. In that case, by means of the interference compensation, the sensors can be made to operate in their dynamic operating range because the possible high-amplitude interferences have been compensated for.

The compensating actuators, i.e. typically coils, can be placed near the assembly of sensors, but, however, farther from the biomagnetic signal source than the sensors. The coils can be secured to a separate frame or some other solid surface.

The mixing of the big interference signal to be processed in the outer feedback loop and the compensating signal with the small-amplitude biomagnetic information included in the inner feedback loop is prevented using the mathematical SSS method (SSS=Signal Space Separation), described in publication FI20030392 (Taulu S., Kajola M., Simola J.: The Signal Space Separation method, Biomed. Tech., 48, in press).

In the SSS method, a magnetic field measured using a multi-channel MEG device is analysed by examining three volumes of different measurement geometries. The interesting source is disposed in measurement volume V1; the sensors are disposed in measurement volume V2 outside volume V1. The sources of magnetic interferences and the compensation coils are outside the aforementioned volumes in volume V3. In this examination, the V3 can also be infinite in volume. In the method, the magnetic field produced by the interesting sources disposed in volume V1 is parametrised in volume V2 as a sum of elementary fields, each of them being irrotational, sourceless and infinite outside volume V1 so that a presentation of the desired accuracy is achieved for the parametrised magnetic field in volume V2. Similarly, the sum magnetic field produced by the interference fields and compensation coils disposed in volume V3 is parameterised in volume V2 as a sum of elementary fields. The signal vectors of the measuring device corresponding to each elementary field are calculated. If a magnetic signal is measured using sensors, then thereafter, the fields produced from sources disposed in different volumes can be separated by calculating the components of the measured signal vector in the basis formed by the signal vectors associated with the elementary fields.

The operation of the interference compensation can be optimised by modifying the values of the feedback resistors, by increasing the number of compensation coils and by changing the places of the coils with respect to the sensors and the measurement object.

In one embodiment of the present invention, the assembly of sensors and the coils functioning as the actuators can be placed inside a magnetically shielding room. This enables one to improve the interference suppression.

The present invention is simpler than the prior-art solutions because as the sensors measuring the level of interference, the measurement sensors of the biomagnetic signal itself are used. The interference suppression is also made more effective because the interferences are measured in the very place where there is a wish to eliminate them. Further, the volume of the region being compensated for is small in the case of the present invention.

As compared to the prior art represented by publication EP0966689, the invention has the advantage that the signal distortion caused by the active compensation is corrected by means of the SSS method.

LIST OF FIGURES

DETAILED DESCRIPTION OF THE INVENTION

Figure 1:
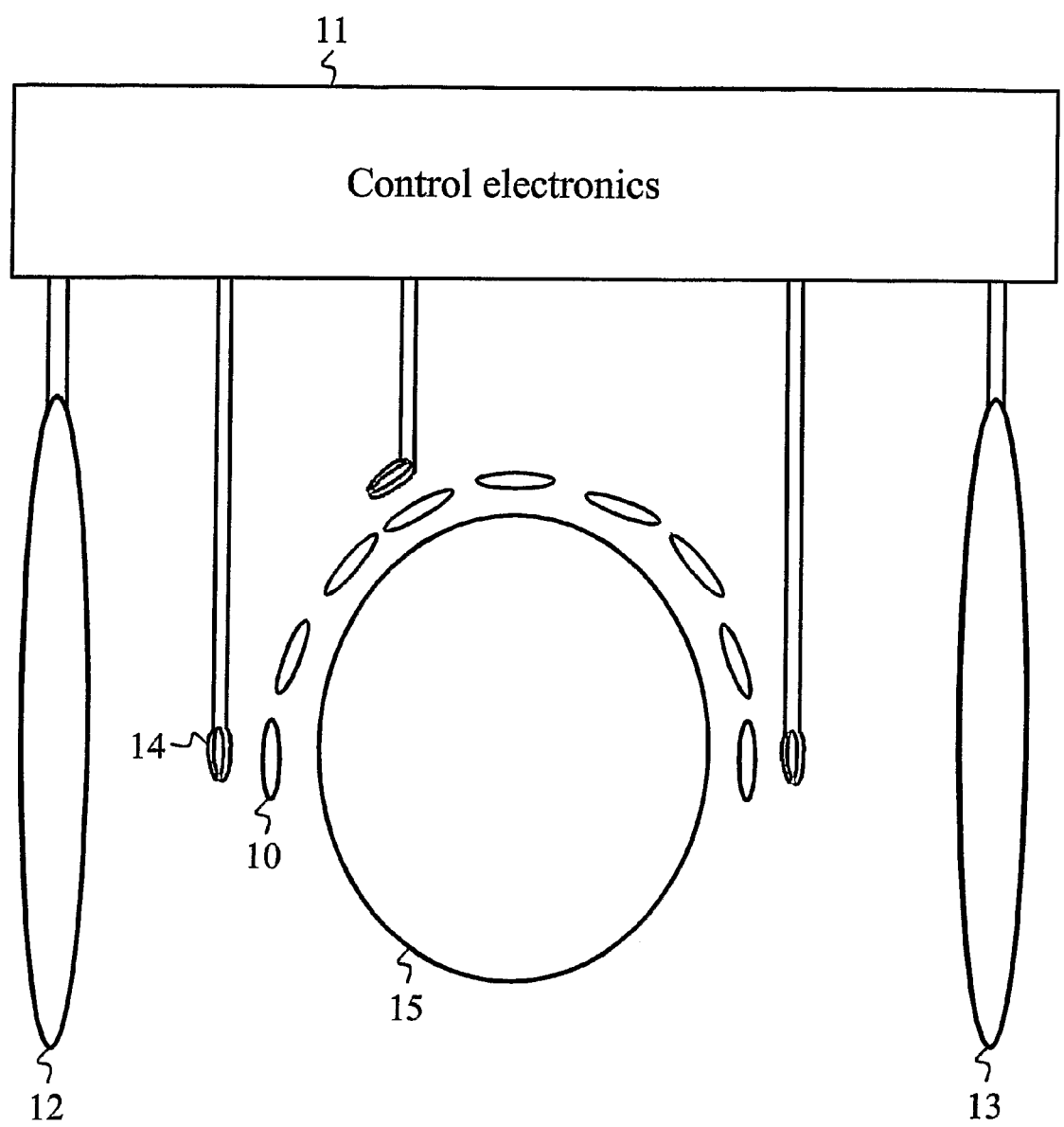
FIG. 1 represents equipment measuring a neuromagnetic signal, as a part of which there is actuator equipment that compensates for the interference.

The substantial principles of the invention are apparent from the accompanying figures. The total structure of the equipment itself is apparent from FIGS. 1 and 2. FIGS. 3 and 4 are functional diagrams that mainly describe the proceeding and processing of the signals in the equipment presented. FIG. 1 illustrates a so-called MEG apparatus which is used to measure a neuromagnetic signal and which has, as a part thereof, a system compensating for the interferences. The device consists of an assembly of sensors 10 (including nine sensors in the example of the figure) surrounding the head of a person being monitored, of the electronics 11 controlling the operation of the measuring device and of the coils 12, 13 used as the actuators of the interference compensation system.

Associated with the sensors of each device is a small-sized feedback coil 14, by means of which the control electronics 11 runs the sensor in a so-called flow-locked state. This means that the control electronics 11 drives current into the feedback coil 14, the field caused by which suppresses in the sensor 10 the field entering it and originating from a source disposed in the object being measured 15. The voltage needed to achieve this current, which is thus proportional to the magnetic effect proceeding from the source 15 to the sensor 10, is the measurement signal given by the channel in question. All the conventional MEG devices have been implemented using this principle.

The feedback coils 14 are sensor-specific. The coils are so small and so positioned that a field caused by them only produces a effect on the sensor of each coil's own. It can be considered that the sensor 10 and the feedback coil 14 together form the component functioning as the physical sensor. In an arrangement such as this, all the measurement channels naturally react to the magnetic fields originating both from the object 15 being measured and from the external interference sources.

To achieve active compensation that shields from external interferences, in the present invention, the measuring device is provided with big compensation coils 12, 13, the current fed into which produces a magnetic field in the entire region of the assembly of sensors. There can be several compensation coils e.g. six pieces—so that the coils are used to produce compensating fields near the assembly of sensors at least in three nearly perpendicular directions.

Figure 2:
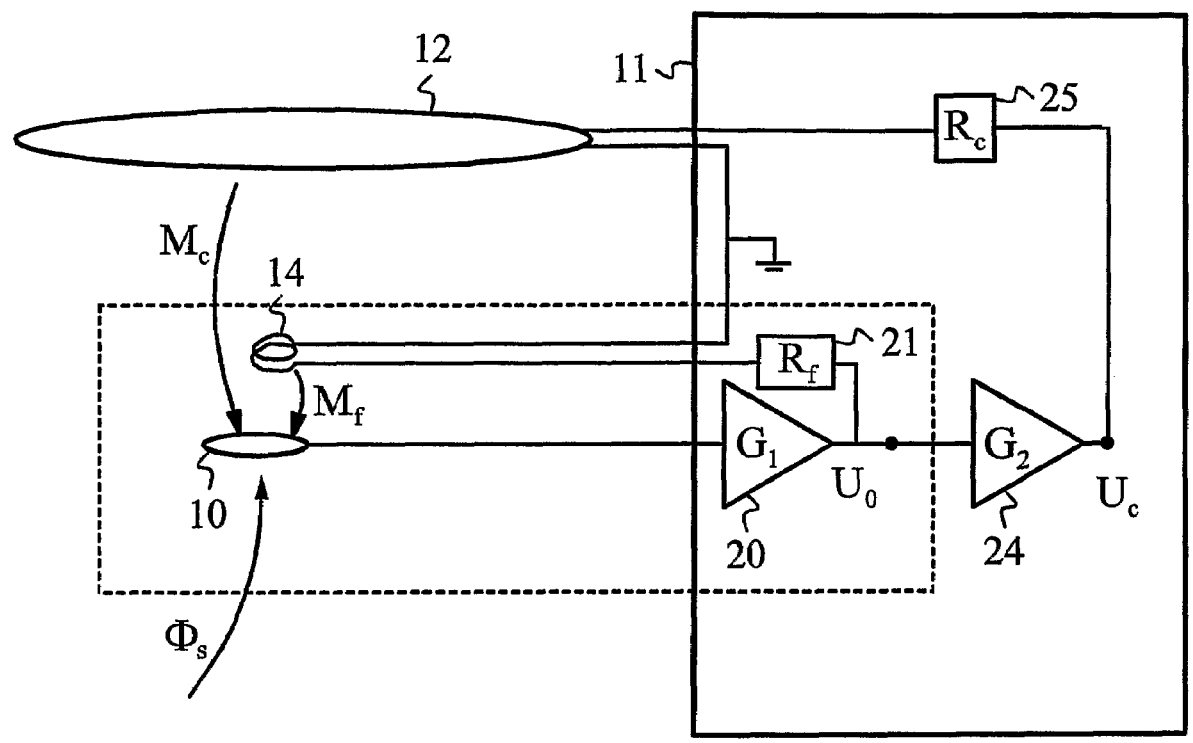
FIG. 2 illustrates a circuit diagram of feedback for one measurement sensor.
Figure 3:
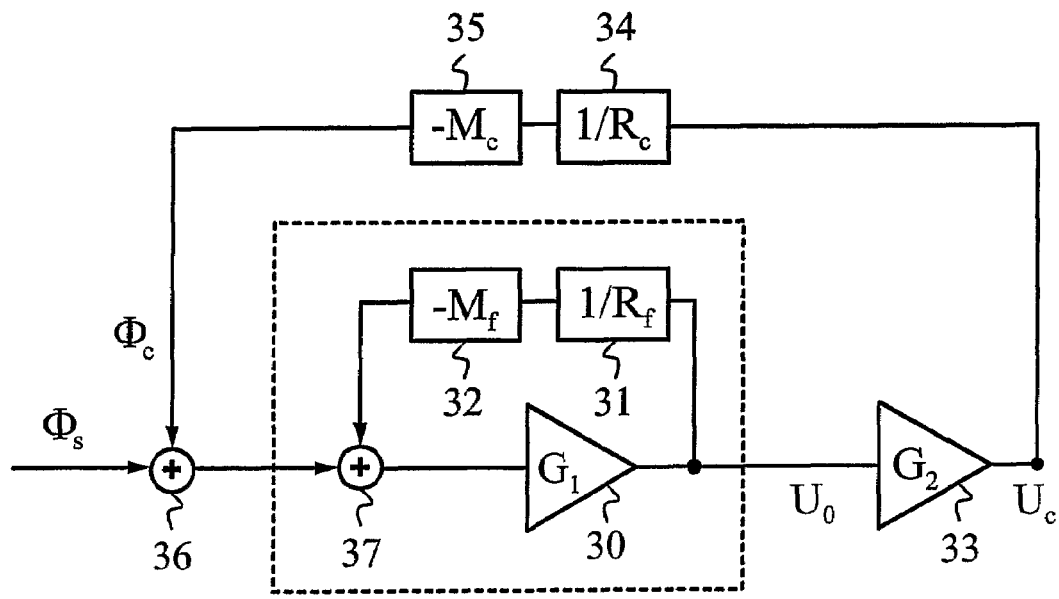
FIG. 3 represents the functional diagram of a control system provided with two feedback loops.
Figure 4:
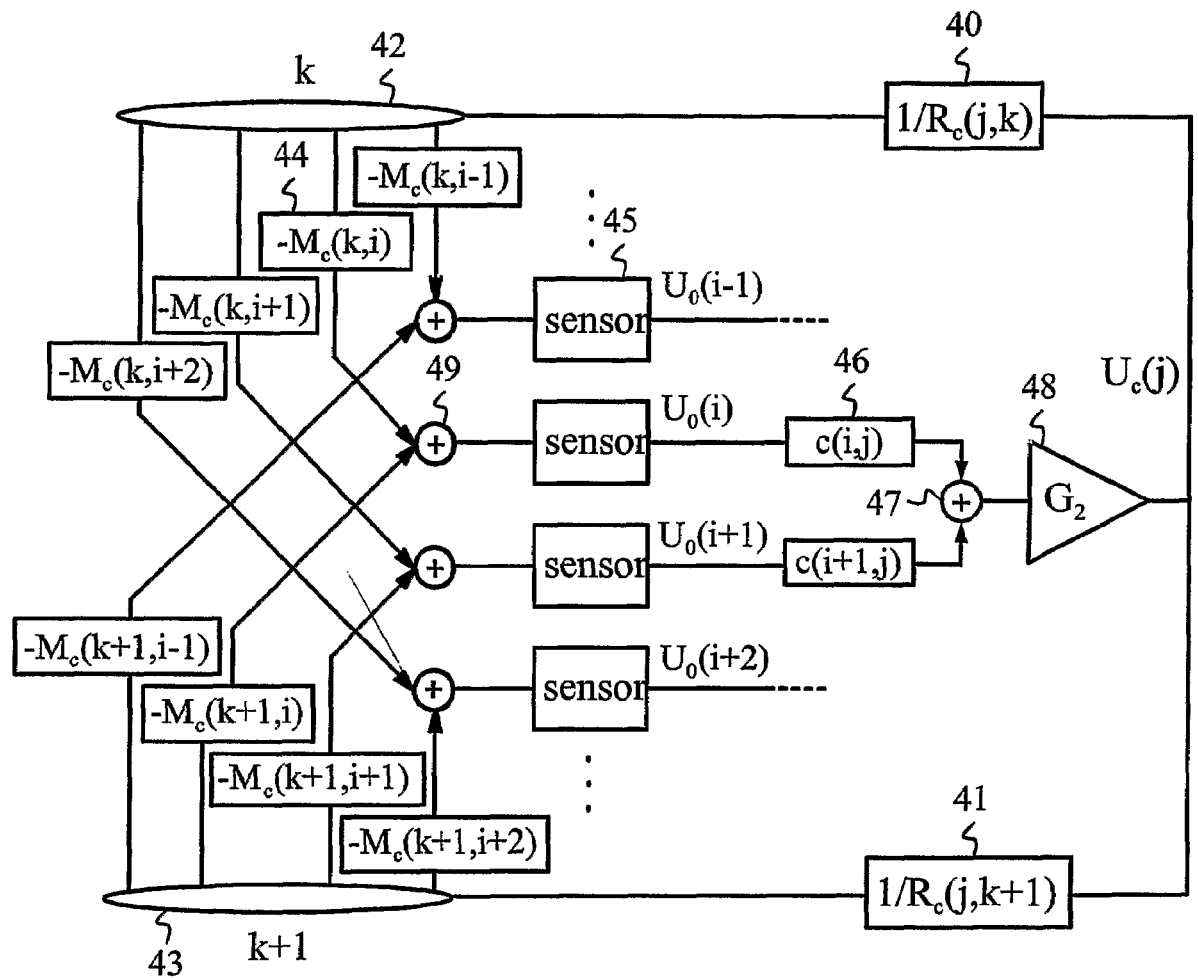
FIG. 4 illustrates a generalisation of the compensation method as shown in FIGS. 2 and 3.

How the operation of the system is controlled by means of the electronics 11 is apparent in more detail from FIGS. 2, 3 and 4. FIG. 2 is a simplified representation illustrating a situation in which e.g. the sensor 10 of FIG. 1 has been fed back via the compensation coil 12. The part within the broken line is a regular MEG channel operating in a flow-locked state, and associated therewith are an amplifier 20, a feedback resistor 21 and a feedback coil 14, which switches to the sensor 10 via mutual inductance $M_f$. The part divided by the broken line can be seen as the actual measurement channel containing, in the previously mentioned wider sense, the sensor 10, 14; and the electronics part 20, 21 disposed within the electronics 11. The voltage $U_0$ is the signal of the channel that is proportional to the magnetic flux $\Phi_s$ visible to the sensor 10. Thus, the magnetic flux comprises the sum of the interesting magnetic flux to be measured and of the magnetic flux produced by external interferences in the location area of the sensor 10.

When this measurement channel is accepted as the channel that gives the difference signal of the feedback active compensation system, the control electronics is provided with an amplifier 24, a feedback resistor 25 and a coil 12. The magnetic field is transferred from the coil 12 to the measuring sensor 10 via the mutual inductance $M_c$.

In FIG. 3 there is a functional diagram illustrating this control system provided with two feedback loops, for which one can calculate a transfer function. The inner feedback loop includes an amplification block 30, a transfer function 31 corresponding to the resistor 21 and a transfer function 32 corresponding to the mutual inductance $M_f$. The outer feedback loop compensating for the interferences includes an amplification block 33, a transfer function 34 corresponding to the resistor 25 and a transfer function 35 corresponding to the mutual inductance $M_c$. In the input of the amplifier 30 (the same as the amplifier 20 in FIG. 2), there is summed the magnetic flux from the external interference source $\Phi_s$ and the magnetic flux $\Phi_c$ compensating for the interferences, as well as the magnetic flux from the inner feedback that switches via the coil 14. This summation is performed in the functional block using summing blocks 36, 37, which do not exist in practice as real components of the system.

The output voltage $U_0$ of the channel and the voltage $U_c$ of the outer feedback loop will be:

$$U_0 = \frac{G_1 \Phi_s}{1 + \frac{G_1 M_f}{R_f} + \frac{G_1 G_2 M_c}{R_c}} \quad (1)$$

$$U_c = G_2 U_0 \quad (2)$$

If the outer feedback loop is omitted ($G_2=0$), there remains a conventional feedback magnetometer—a part which is disposed within a broken line in FIGS. 2 and 3 and the calibration of which is determined by the transfer function of the inner feedback loop:

$$U_0 = \frac{R_f}{M_f} \Phi_s, \quad \text{when } G_1 \frac{M_f}{R_f} \gg 1 \quad (3)$$

When the outer feedback loop is introduced, provided with sufficient amplification, in other words when $G_2^*(M_c/R_c) \gg M_f/R_f$, then:

$$U_0 = 0 \text{ and } U_c = \frac{R_c}{M_c} \Phi_s \quad (4)$$

As a result of introducing the outer feedback loop, the output signal of the channel is thus lost, and a current that produces a compensating magnetic field appears in the compensation coil 12. When a signal is produced by an outer interference source and if one has managed to build the compensation coil(s) 12 so that it produces in the entire sensor region a field that is as closely as possibly of the same form as this external interference source, then the same compensation of the output signal is performed also for all the other sensors in the assembly, although in their feedback, the outer loop has been omitted ($G_2=0$). This is exactly the shielding effect at which one aims by adding the outer feedback loop.

As for the control of the outer feedback loop, the same magnetomer channels are used that are also used to measure the biomagnetic signal being monitored, it is obvious that the outer feedback also influences this biomagnetic signal. For example, a channel that has an outer loop added to its feedback ($G_2>0$) also looses the biomagnetic signal as a result of this arrangement.

The basic idea of the present invention is included in how this non-desired effect can be prevented in a simple manner. Firstly, we think of a system in which there are no feedback loops activated. The measurement channels of a system such as this register both the big interference signals from externals sources and weak biomagnetic signals. Publication FI20030392 discloses a method (SSS method); Taulu S., Kajola M., Simola J.: The Signal Space Separation method, Biomed. Tech., 48, in press) enabling one, in a situation such as this, to separate from one another, with a high accuracy, the signals that come outside and inside the device's measurement region, provided that the arrangement of the device's channels is suitable and their number sufficient (at least 200).

This numerical method would be enough as such to eliminate the external interferences from a measured signal, provided that the interferences would remain so small that the dynamic region of none of the measurement channels of the set of sensors is not exceeded. It is exactly this exceeding that can be prevented with the compensation method described in the present invention. As the compensation method is implemented using coils placed outside the measurement region of the device, the effect of the compensation current associated with this outer feedback loop on the signals can be likewise separated, using the SSS method, from a signal originating from the measurement region.

As an example, we refer to a situation in which a shielding method based on an outer compensation loop would seem to function in a most impractical manner. We assume that there are no external interferences and that the sensor functioning as the difference signal channel only sees the biomagnetic signal. It reacts to this by feeding to the compensation coil a current that produces a compensating field that compensates for the biomagnetic field at the spot where the sensor is located. Apparently, the feedback of the outer loop thus functions so that although there is no external interference, it is exactly the interesting signal that is lost.

Thus, the biomagnetic signal is driven to zero by activating the compensating source of the magnetic field, external of the measurement region. It is exactly the effect of this kind of external source that can be numerically separated by the SSS method, resulting in that there is left in the difference signal channel just the original biomagnetic signal. The SSS method reconstructs in the difference signal channel—and in the rest of the channels as well—signals that would have been detected in them, if the outer feedback loop was not activated. This reconstruction is based on the measurement that is made simultaneously for both the biomagnetic source and the compensation coil by the assembly of magnetometers.

The SSS method naturally functions in the same manner in conjunction with interference compensation, that is when the difference signal channel receives part of its signal from an interference source that is disposed outside the measurement region or even outside the entire set of compensation coils. In these cases, both the original source and the compensation coil that activates as a part of the feedback loop are disposed outside the measurement region; and their portion of the signals can be eliminated by the SSS method. In this case, the compensation system only is responsible for modifying the external interference so that all the sensors stay in their dynamic area, enabling one to collect the signals needed by the numerical system as inputs.

Because as the interference to be compensated for functions a vector field which is not constant in the region of the entire assembly of sensors, to achieve a sufficiently good compensation, it is usually necessary to use a set of compensation coils that can be used to achieve various fields in direction and form. Specifically the set of coils must be able to produce the field forms of the most powerful external interferences as accurately as possible, or to be more specific, the compensating fields of these, in the entire region of the assembly of sensors. FIG. 4 is a functional diagram illustrating a generalisation of the compensation method formed by several compensation coils as shown in FIG. 3.

In FIG. 4, the voltage $U_c$ that produces the compensation current has been coupled with two coupling intensities to be selected separately ($1/R_{c,j}$ and $1/R_{c,j+1}$) 40, 41 to two different coils 42, 43, respectively. The inductive couplings $M_{ji}$ etc. 44 are determined based on the location of the compensation coils 43, 43 and on the location and position of the sensors 45 in the assembly of sensors. $U_c$ can be coupled to more than one coil. In addition, in FIG. 4, the difference signal that produces the compensation voltage has been formed as a linear combination from the signals of two different sensors 45. In the formation of the linear combination, the weighting coefficients $C_{i,j}$ 46 are used for the sensors 45; and the terms are summed by the summer 47. It also possible to use more than two channels for the formation of the linear combination. The necessary transfer function of the amplifier of the feedback loop is $G_2$, 48. Furthermore, it is also possible to generate several compensation voltages $U_c,n$ using for the formation of the difference signal, different linear combinations of the signals of the assembly of sensors 45 and to feed the voltages to the different coils 42, 43 of the set of compensation coils using optimal weighting coefficients. In the functional diagram as shown in FIG. 4, the sum flow of the compensating magnetic flows visible to the sensor 45 is obtained from the outputs of the summers 49. In practice, the summers 49 do not exist in the system as real components. The summers 49 are used to describe the total effect of the fields produced by the compensation coils (the total field is the sum of the sub-fields) for each sensor.

In this manner there is formed the outer feedback loop that performs the interference compensation of a multi-channel device, which feedback loop is described by the two matrixes: the $c_{ij}$ matrix that describes the structure of a direct coupling loop and determines the weighting coefficient of the ith sensor 45 in the jth difference signal, and the $1/R_{jk}$ matrix that describes the feedback loop and determines the weighting coefficient of the jth compensation current in the total current to be fed to the kth coil 42, 43.

The selection of these two matrixes enables one to optimise the performance of the interference compensation. The compiling of the difference signal as a linear combination from several channels that are e.g. disposed on different sides of the assembly of sensors is advantageous because it improves the accuracy of the difference signal and shortens the effective extrapolation distance over the assembly of sensors. In a conventional system that uses separate reference sensors, the sensor that gives the difference signal can be disposed even at a distance of 50 cm from the farthest sensor being compensated for in the assembly of sensors, resulting in that the interference intensity evaluated based on the difference signal is inaccurate because of the geometric reasons. By forming the difference signal from the signals of the sensors disposed on different sides of the assembly, the extrapolation range can be shortened to have the size of the radius of the assembly, that is to about 12 cm.

By means of the compensation loop, the field forms that were fed back can, in turn, be customised, to correspond, as accurately as possible, to the geometric form of the biggest external interferences by using a sufficiently big number of compensation coils and by determining the correct weighting coefficients for the $1/R_{jk}$ matrix. A typical number of compensation voltages $U_{c,j}$ and compensation coils is e.g. six, whereby the $1/R_{jk}$ matrix is 6*6 matrix.

In FIGS. 1-4 there have been used symbols that refer to the implementation of the feedback that compensates for external interferences using analogy electronics. This has been done for illustrative purposes only. In a modern implementation, one uses signal processors or real-time computers in which the weighting coefficient matrixes $c_{ij}$ and $1/R_{jk}$ and the transfer function $G_2$ are programmed.

The invention is not limited merely to the embodiment examples referred to above; instead many variations are possible within the scope of the inventive idea defined by the claims.

The invention claimed is:

1. A method for shielding an assembly of sensors that measures biomagnetic signals from external interferences, the assembly of sensors comprising at least one sensor, characterised in that the method comprises the steps of:
   providing the assembly of sensors with at least one magnetic feedback, wherein the difference signal of one feedback is obtained from at least one sensor of the aforementioned assembly of sensors;
   producing in the region of the assembly of sensors a magnetic field that compensates for external interferences with at least one actuator disposed outside the assembly of sensors; and the difference signal that produces a compensation voltage in the actuator is a linear combination of the signals of one or more sensors; and
   using the SSS method to separate the biomagnetic useful signal being measured from the signals (originating from outside the measurement region), which signals are produced by the actuators and the external interferences.

2. The method as defined in claim 1, characterised in that the method further comprises the steps of:
   forming a difference signal as a linear combination from the signals of two or more sensors of the assembly of sensors; and
   feeding back the difference signal to the actuators, the compensating magnetic field being formed as a linear combination from the magnetic field produced by at least one actuator.

3. The method as defined in claim 2, characterised in that the method further comprises the step of:
   selecting the difference signals to be obtained as a linear combination and the actuators to be used so that as the feedback is switched on, the external interference signal is minimised.

4. The method as defined in claim 1, characterised in that the method is used in a magnetoencephalographic device (MEG).

5. The method as defined in claim 4, characterised in that the measurement sensor is coupled to two feedback loops, the first of them being a channel of an MEG device that operates in a flow-locked state and the second a feedback loop that controls the compensating actuator.

6. The method as defined in claim 1, wherein in the SSS method, a magnetic field that has been registered using a multi-channel measuring device is analysed in a geometry in which the interesting source is disposed in measurement volume V1, the sensors measuring the field or the components thereof outside volume V1 in volume V2, and the sources of the magnetic interferences and the actuators outside volume V1 and V2 in volume V3, which can be infinite, characterised in that the method further comprises the steps of:
   parametrising the magnetic field produced by the interesting sources disposed in volume V1 in volume V2 as a sum of elementary fields, each of which is irrotational, sourceless and finite outside volume V1 so that a presentation of the desired accuracy is achieved for the parametrised magnetic field in volume V2;
   parametrising the sum magnetic field produced by the interference sources and compensating actuators disposed in volume V3 in volume V2 as a sum of elementary fields, each of which is irrotational, sourceless and finite outside volume V3 so that a presentation of the desired accuracy is achieved for the parametrised magnetic field in volume V2;
   calculating the signal vector of the measuring device corresponding to each elementary field;
   measuring the magnetic signal using sensors; and
   separating the fields produced from sources disposed in different volumes by calculating the components of the measured signal vector in the basis formed by the signal vectors associated with the elementary fields.

7. The method as defined in claim 1, characterised in that the actuator is a coil.

8. The method as defined in claim 2, characterised in that the method further comprises the step of:
   feeding back the measured signal to the actuator via an amplifier and a feedback resistor.

9. The method as defined in claim 8, characterised in that in the method, the operation of the interference compensation to be produced using actuators is optimised by varying the values of the feedback resistors, by increasing the number of actuators and by varying the locations of the actuators.

10. The method as defined in any one of previous claims 1-3, characterised in that the method further comprises the step of:
    placing the assembly of sensors and the actuators within a magnetically shielding room.

11. A system for shielding an assembly of sensors measuring biomagnetic signals from external interferences, the system comprising:
    an assembly of sensors (10, 45) comprising at least one magnetic sensor;
    a feedback coil (14) coupled to each sensors;
    control electronics (11) controlling the measuring device;
    characterised in that the system further comprises:
    at least one magnetic feedback coupled to an assembly of sensors, wherein the difference signal of one feedback is obtained from at least one sensor (10, 45) of the aforementioned assembly of sensors;
    at least one actuator (12, 13, 42, 43) disposed outside the assembly of sensors for producing a magnetic field in the region of the assembly of sensors (10, 45), the magnetic field compensating for external interferences; and the difference signal that produces a compensation voltage in the actuator is a linear combination of the signals of one or more sensors, (10, 45); and
    control electronics (11) for separating the biomagnetic useful signal from the signals (originating from outside the measurement region), which signals are produced by the actuators and the external interferences.

12. The system as defined in claim 11, characterised in that the system further comprises:
    generation means (46, 47) of the difference signal for generating the difference signal as a linear combination from the measurement signals of two or more sensors (45) of the assembly of sensors; and
    the aforementioned magnetic feedback (48, 40) for feeding back the difference signal to the actuators (42, 43), the compensating magnetic field being formed as a linear combination from the magnetic field produced by at least one actuator (42, 43).

13. The system as defined in claim 12, characterised in that the system further comprises:
the aforementioned difference signals and actuators (12, 13, 42, 43) so selected that as the feedback is switched on, the external interference is minimised.

14. The system as defined in claim 11, characterised in that the assembly of sensors (10, 45), the feedback coils (14) and the control electronics (11) function as parts of a magnetoencephalographic device (MEG).

15. The system as defined in claim 14, characterised in that the system further comprises:
each measurement sensor (10, 45) coupled to two feedback loops, the first of them being a channel of an MEG device operating in a flow-locked state and the second a feedback loop controlling the compensating actuator (12, 13, 42, 43).

16. The system as defined in claim 11, wherein in the SSS method, a magnetic field that has been registered using a multi-channel measuring device is analysed in a geometry in which the interesting source (15) is disposed in measurement volume V1, the sensors (10, 45) measuring the field or the components thereof outside volume V1 in volume V2, and the sources of the magnetic interferences and the actuators outside volume V1 and V2 in volume V3, which can be infinite, characterised in that the control electronics (11) is arranged to:
parametrise the magnetic field produced by the interesting sources disposed in volume V1 in volume V2 as a sum of elementary fields, each of which is irrotational, sourceless and finite outside volume V1 so that a presentation of the desired accuracy is achieved for the parametrised magnetic field in volume V2;
parametrise the sum magnetic field produced by the interference sources and compensating actuators (12, 13, 42, 43) disposed in volume V3 in volume V2 as a sum of elementary fields, each of which is irrotational, sourceless and finite outside volume V3 so that a presentation of the desired accuracy is achieved for the parametrised magnetic field in volume V2;
calculate the signal vector of the measuring device corresponding to each elementary field;
measure the magnetic signal using sensors (10, 45); and
separate the fields produced from sources disposed in different volumes by calculating the components of the measured signal vector in the basis formed by the signal vectors associated with the elementary fields.

17. The system as defined in claim 11, characterised in that the aforementioned actuator (12, 13, 42, 43) that produces the magnetic field is a coil that has been connected to a device containing an assembly of sensors (10, 45) or to a separate frame around the assembly of sensors (10, 45), or to the walls, floor or ceiling.

18. The system as defined in claim 12, characterised in that the system further comprises:
an amplifier (24), a feedback resistor (25) and an actuator (12) as parts of the magnetic feedback.

19. The system as defined in claim 18, characterised in that in the system, the operation of the interference compensation to be produced using actuators (12, 13, 42, 43) is optimised by varying the values of the feedback resistors (25), by increasing the number of actuators (12, 13, 42, 43) and by varying the locations of the actuators (12, 13, 42, 43).

20. The system as defined in claim 11, characterised in that the system further comprises:
a magnetically shielding room as a place for the assembly of sensors (10, 45) and the actuators (12, 13, 42, 43).

* * * * *